United States Patent
Pamulaparthy et al.

(10) Patent No.: US 12,334,730 B2
(45) Date of Patent: Jun. 17, 2025

(54) SYSTEMS AND METHODS FOR MALICIOUS CONTROL DETECTION IN A POWER GRID

(71) Applicant: GE Vernova Infrastructure Technology LLC, Greenville, SC (US)

(72) Inventors: Balakrishna Pamulaparthy, Hyderabad (IN); Palak Praduman Parikh, Markham (CA)

(73) Assignee: GE Vernova Infrastructure Technology LLC, Greenville, SC (US)

( * ) Notice: Subject to any disclaimer, the term of this patent is extended or adjusted under 35 U.S.C. 154(b) by 79 days.

(21) Appl. No.: 18/298,892

(22) Filed: Apr. 11, 2023

(65) Prior Publication Data

US 2024/0348047 A1    Oct. 17, 2024

(51) Int. Cl.
*H02J 3/00* (2006.01)
*G01R 19/25* (2006.01)
*H02J 13/00* (2006.01)

(52) U.S. Cl.
CPC ........ *H02J 3/0012* (2020.01); *G01R 19/2513* (2013.01); *H02J 13/00002* (2020.01)

(58) Field of Classification Search
CPC ..... G06N 20/00; G01R 19/2513; G01R 31/40
See application file for complete search history.

(56) References Cited

U.S. PATENT DOCUMENTS

| | | | | |
|---|---|---|---|---|
| 2019/0068618 A1* | 2/2019 | Mestha | ............... | H04L 63/1466 |
| 2020/0233956 A1* | 7/2020 | Wang | ............... | B60L 53/305 |
| 2020/0293032 A1* | 9/2020 | Wang | ............... | G01R 19/2513 |
| 2020/0333767 A1* | 10/2020 | Engelstein | ............... | H04Q 9/00 |
| 2021/0081270 A1 | 3/2021 | Abbaszadeh et al. | | |
| 2021/0103006 A1* | 4/2021 | Menzel | ............... | G05B 23/024 |
| 2022/0050130 A1 | 2/2022 | Song et al. | | |
| 2023/0164156 A1* | 5/2023 | Grossman | ............... | F03D 17/00 726/22 |

OTHER PUBLICATIONS

International Search Report and Written Opinion, PCT/US2024/023566, dated Aug. 7, 2024 (15 pp.).

* cited by examiner

*Primary Examiner* — Huy Q Phan
*Assistant Examiner* — Temilade S Rhodes-Vivour
(74) *Attorney, Agent, or Firm* — Eversheds Sutherland (US) LLP

(57) ABSTRACT

The present application provides a system for malicious control detection in power grids. The system includes at least one node configured to detect power grid parameters for each power phase and generate a signal indicative of time-series sensor measurements for each power phase. A controller in communication with the node may be configured to receive from the at least one node, the respective signals, extract at least one feature from the respective signals, provide the at least one feature as an input to a deep-learning model, receive an output from the deep-learning model indicative of a relationship between the power grid parameters and a node health associated with the at least one node, generate a status tag associated with the at least one node based at least in part on the output, wherein the status tag is normal or malicious, and generate a status signal indicative of the status tag.

20 Claims, 5 Drawing Sheets

SYSTEMS AND METHODS FOR MALICIOUS CONTROL DETECTION IN A POWER GRID

TECHNICAL FIELD

The present disclosure relates to power grids, and in particular, to systems and methods for malicious control detection in power grids.

BACKGROUND

A power grid includes a network of nodes and lines, used to transmit power from one or more energy sources for consumption at various locations. Power grids typically employ a three-phase system to transmit greater electric power compared to single-phase or direct current systems. Changing external conditions or conditions within components of the grid may cause faults. For example, faults and anomalies may include shorts, grounding, arcing, surges, or the like, or other phenomenon that can trigger circuit breakers.

However, cyber-attacks may result in mimicking faults, anomalies, or other circuit breaker conditions, and triggering inadvertent or unnecessary actions. Malicious actors may also assume control and send control commands to elements of the grid, for example to breakers.

Accordingly, there remains a need for the detection of malicious control in power grids.

SUMMARY

The present disclosure relates to power grids, and in particular, to systems and methods for malicious control detection in power grids.

In embodiments, the present disclosure describes a system for malicious control detection in power grids. The system includes at least one node configured to detect power grid parameters for each power phase. The at least one node is configured to generate a signal indicative of time-series sensor measurements for the each power phase. The system further includes a controller in communication with the node. The controller is configured to receive from the at least one node, the respective signals, extract at least one feature from the respective signals, provide the at least one feature as an input to a deep-learning model, receive an output from the deep-learning model indicative of a relationship between the power grid parameters and a node health associated with the at least one node, generate a status tag associated with the at least one node based at least in part on the output, wherein the status tag is normal or malicious, and generate a signal indicative of the status tag.

In embodiments, the present disclosure describes a method for malicious control detection in power grids. The method includes receiving, by a controller, from at least one node configured to detect power grid parameters for each power phase, a signal indicative of time-series sensor measurements for the each power phase. The method further includes extracting, by the controller, at least one feature from the respective signals. The method further includes providing, by the controller, the at least one feature as an input to a deep-learning model. The method further includes receiving, by the controller, an output from the deep-learning model indicative of a relationship between the power grid parameters and a node health associated with the at least one node. The method further includes generating, by the controller, a status tag associated with the at least one node based at least in part on the output. The status tag is normal or malicious. The method further includes generating, by the controller, a signal indicative of the status tag.

Additional systems, methods, apparatus, features, and aspects can be realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

Having thus described the disclosure in general terms, reference will now be made to the accompanying drawings, which are not necessarily drawn to scale.

Figure 1:
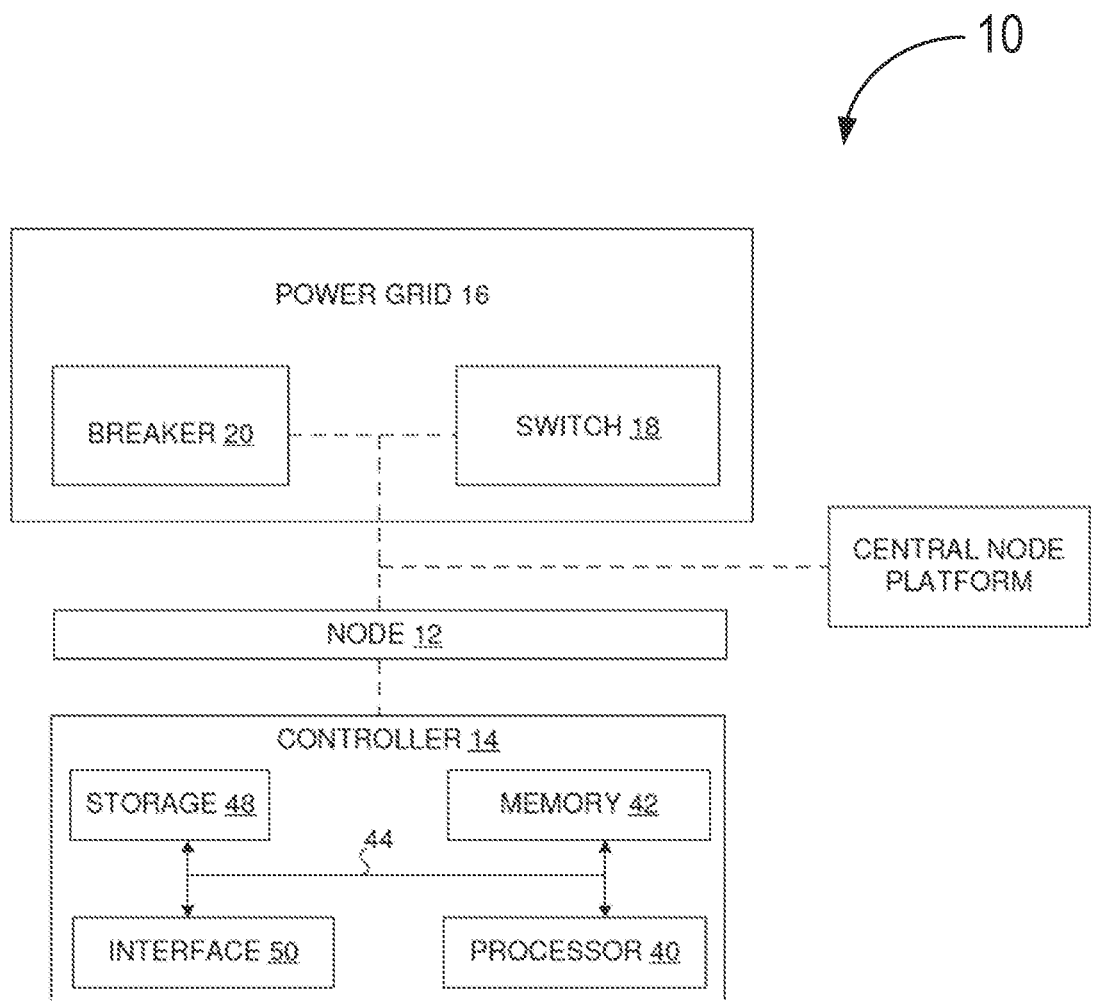

FIG. 1 is a block diagram showing a system for malicious control detection of a power grid.

Figure 2:
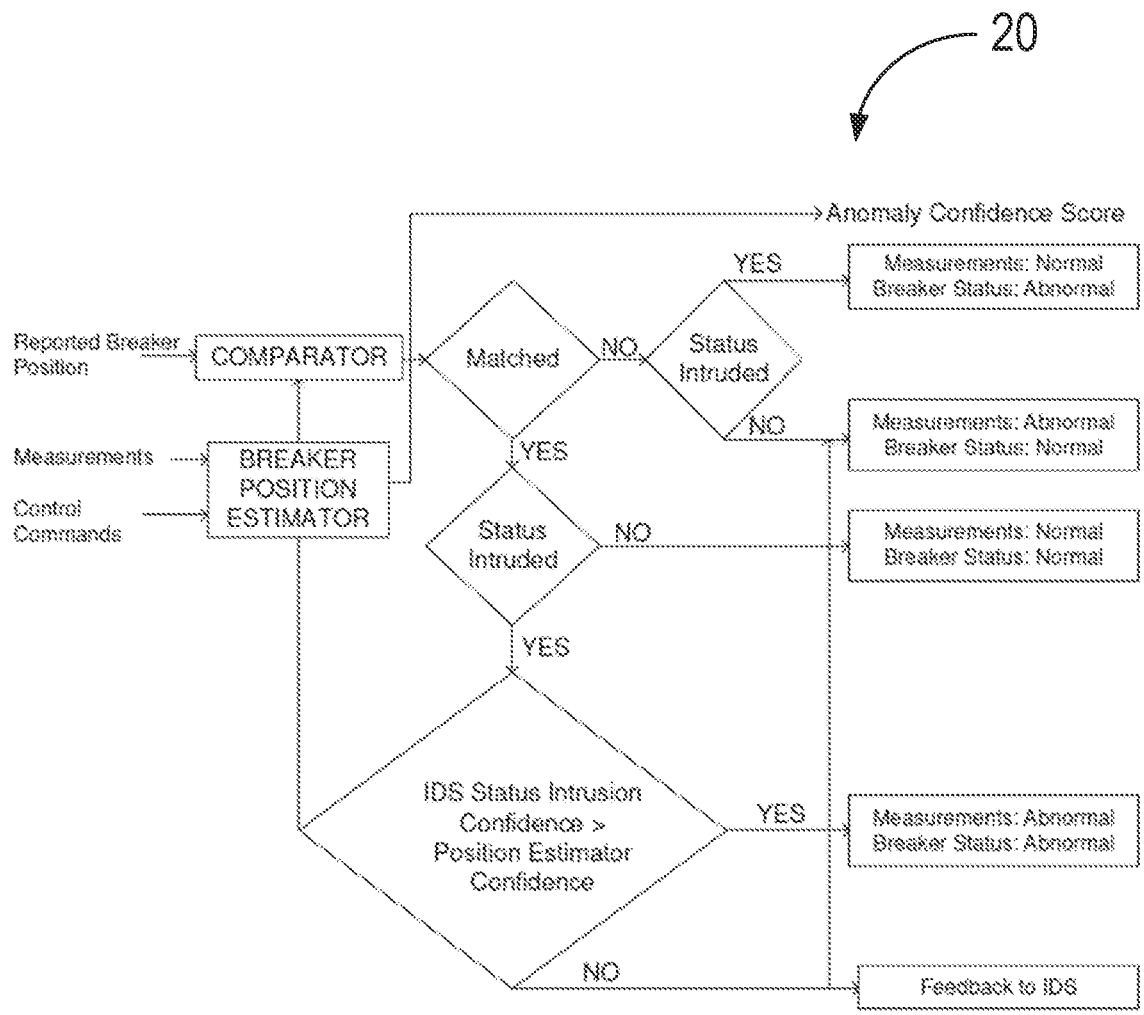

FIG. 2 is a flowchart representing the determination of various breaker statuses in response to monitoring breaker parameters.

Figure 3:
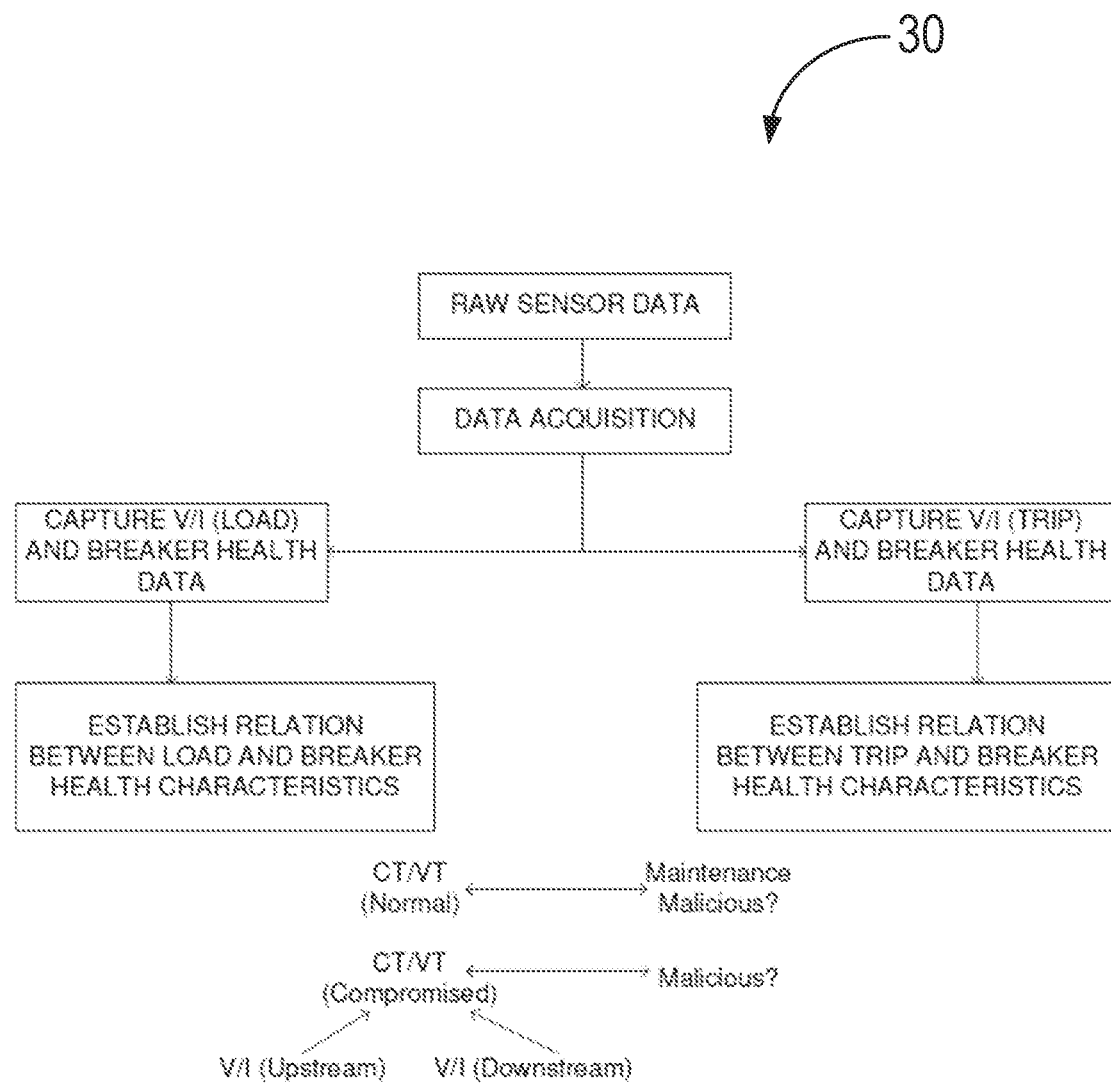

FIG. 3 is a flowchart representing a scheme for establishing relationship between breaker health characteristics and normal load or trip.

Figure 4:
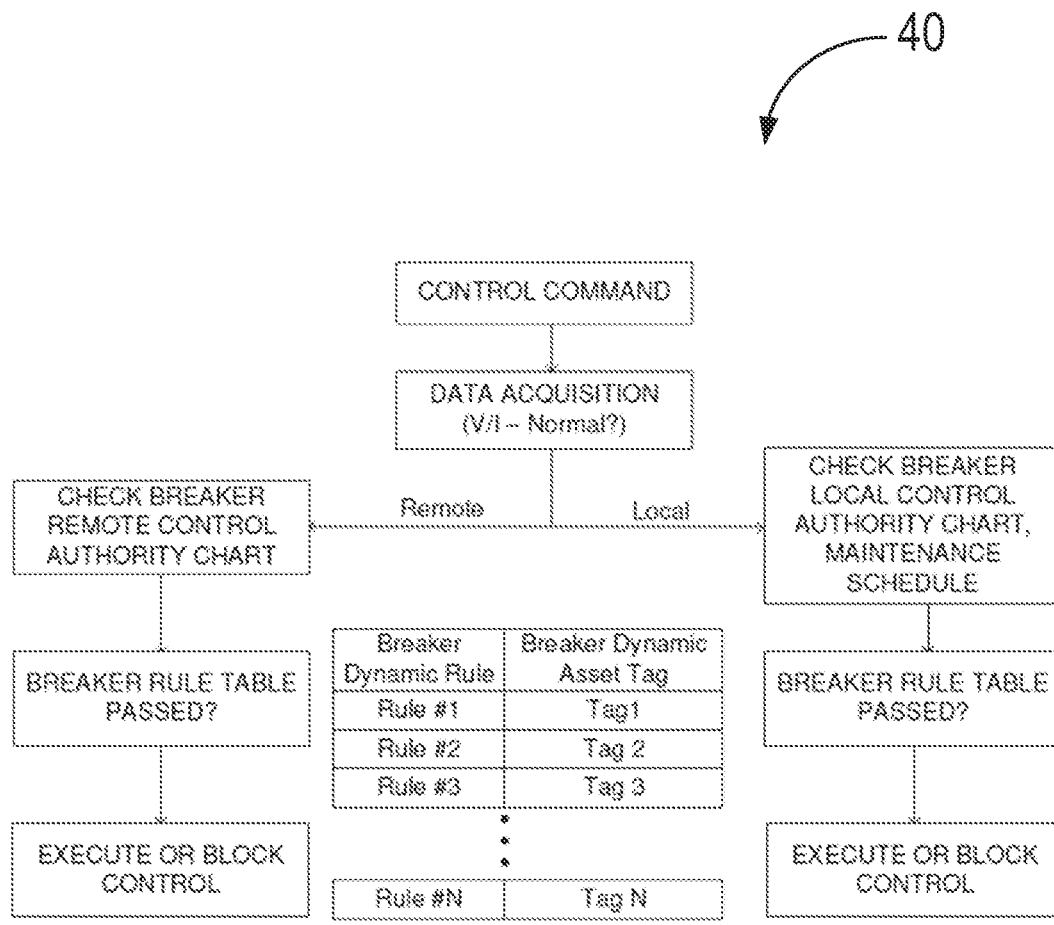

FIG. 4 is a diagram representing a scheme for determining whether a control command is malicious and executing or blocking the control command based on a rule table.

Figure 5:
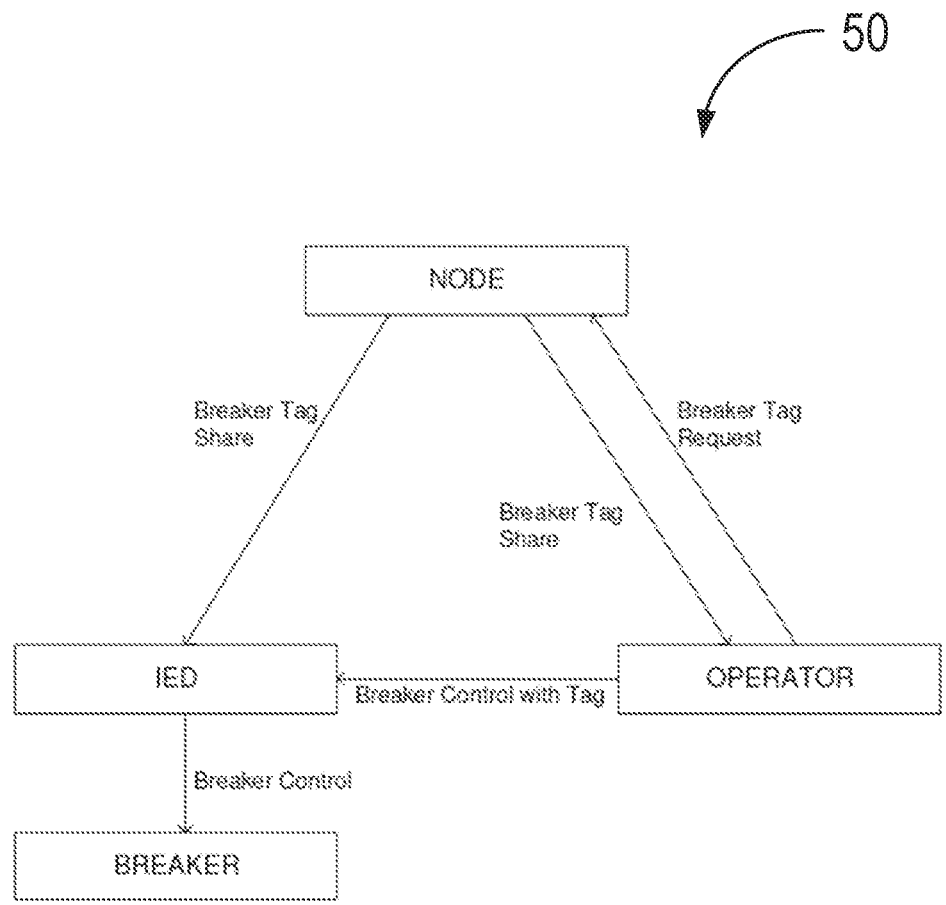

FIG. 5 is a diagram representing a scheme for sharing a breaker tag to authorize breaker control.

Embodiments of the disclosure are described more fully below with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the present disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the present disclosure. However, it will be apparent that the present disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

DETAILED DESCRIPTION

The present disclosure relates to power grids, and in particular, to systems and methods for malicious control detection in power grids. A power grid may include a network of nodes and lines, with nodes representing power sources or sinks, and lines representing connections between the nodes.

Certain methods may detect attacks based on information from Information Technology systems ("IT," such as, computers that store, retrieve, transmit, manipulate data) and Operation Technology systems ("OT," such as direct monitoring devices and communication bus interfaces).

In embodiments, the present disclosure describes systems and methods for malicious control detection in power grids. For example, systems and methods according to the present disclosure may be used for detection and isolation of cyber-attacks in one or more circuit breaker/reclosers/other switches in a grid substation or reclosers/other switches in a distribution network. The system receives time-series measurements from a plurality of the system monitoring nodes (for example, sensors or actuators) of the circuit breaker/recloser/other switch as well as the reported circuit breaker/recloser/other switch status (i.e. the estimated breaker/recloser/other switch position), and automatically detects anomalies in the breaker/recloser/other switch status and/or measurements.

Customers may benefit from layered cybersecurity and comprehensive surveillance on both cyber intrusions and operation anomalies, while still satisfying regulatory requirements. Previous solutions offer only intrusion detection, and customers have to come up with the mitigation plan or rely on the vendors for mitigation. This may involve multiple solutions from multiple vendors that do not interact with each other. The present disclosure describes an AI-based anomaly detection system and method at the cyber-physical layer, which is modular, robust, and computationally efficient for real time deployment. In addition, the present disclosure addresses variations and multi-OEM suppliers of the equipment through two-class (using digital twins) or one-class learning using only normal data (no abnormal simulation needed for training), and, hence, is asset agnostic.

While unsupervised learning using AI/ML techniques that are based on only data may also be used for anomaly detection, those methods need extended training and preparation periods. For example, weeks to months of pre-installation periods may be needed for training at a site before becoming operational, and such AI/ML techniques that are based on only data may have significantly high false alarm rates at the beginning. In contrast, systems and methods according to the present disclosure may be fully operational from installation and have high accuracy with low false positive rates with the assistance of physics-based real-time data monitoring.

Systems and methods according to the present disclosure may thus provide automated and intelligent detection through predetermined rules and machine learning algorithms that help to detect security incidents and operational anomalies. Further, such systems and methods may be computationally fast and capable of making rapid and real-time detection and isolation of breaker/recloser/other switch operations. Robust, rapid and vetted detection against coordinated attacks, with a low false positive rate may be further provided.

An AI-based cyber-physical anomaly detection system may be used for the grid substation or distribution system, and trained based on machine learning and deep learning methods to learn the physical behavior of the system using simulation data and/or historical data from the substation operation. The anomaly detector may be trained off-line and deployed with some adaptive features, such as automatic hyperparameter optimization while in real-time operation. The anomaly detector typically has very small computational and memory footprints which are suitable for rapid prediction within milliseconds. The AI-based anomaly detector, which may be with or without dependence on an intrusion detection or prevention system (IDS), may work together with the IDS and share information in the machine learning feature extraction stage (i.e., the latent input space to the anomaly classifier) or the anomaly decision stage (i.e., decision fusion) to have a robust, rapid, and vetted detection against coordinated attacks, with a low false positive rate.

Malicious breaker/recloser/other switch control sequence: A control command (for example to open or close a circuit breaker/recloser/other switch) may be observed on the network without being accompanied by scheduled maintenance, and the command control may not be sent by an authorized operator. In such a case, the system will generate an alert regarding a potentially malicious control sequence. When the system observes that a breaker/recloser/other switch is controlled to move from open to close (position change from ON to OFF) or vice versa, this condition is checked against the grid measurements of voltages andcurrents to determine if the measurements and the status of the breaker/recloser/other switch are normal or abnormal. The system may also confirm if the control command is received from a local station or a remote station. If any discrepancies are identified that deviate from a normal control behavior sequence, the system may send an alert or notification to a maintenance person and/or an operator that a breaker/recloser/other switch is being controlled maliciously. The maintenance person and/or operator can then acknowledge and clear the alert or take alternative actions to respond.

Many of the breaker/recloser/other switch health parameters are derived from the current signal. Thus, if measurements are compromised, the health of the breaker/recloser/other switch is as well. To induce an artificial panic, an intruder may intentionally represent breakers/reclosers/other switches as unhealthy with a higher risk index as well. Thus, breaker/recloser/other switch health indication alerts may be monitored 1) when voltage and/or current measurements are compromised, and 2) when the system indicates incorrect breaker/recloser/other switch health data that does not match with forecasted health data from the intrusion detection and prevention system. Intentional control of a breaker/recloser/other switch may be under three circumstances: 1) electrical fault, 2) maintenance scheduled for the breaker/recloser/other switch, and 3) a manual trip by an operator or an automatic trip under extreme conditions like load shedding, unstable system operation, weather-related conditions (for example, storms), or auto-reclosure operations. In the event of an electrical fault, voltage and current data will differ and the system will be aware of normal control operations. But, in the event of scheduled maintenance or a trip, the system will alert operators that the breaker/recloser/other switch is tripped but that voltage and current data appeared normal before the trip, so that operators can determine if the attempted control of the breaker/recloser/other switch is legitimate. The present system may be used to automatically detect/block unintentional control of the breaker/recloser/other switch from unauthorized sources or cyberattacks, thus preventing the need for a manual acknowledgement process each time control of a breaker/recloser/other switch is attempted.

A controller of the system may acquire raw sensor data of voltage and current signals of each breaker/recloser/other switch, for example, in real-time or near real-time, or at predetermined time intervals.

The controller may compute or measure breaker/recloser/other switch health data, for example, arcing current/energy, temperature, operational times, or insulation strength when the breaker/recloser/other switch is healthy under normal loading and fault conditions.

The controller may use a machine learning (ML) or deep-learning algorithm to determine a relation between voltage and current data and breaker/recloser/other switch health characteristics under normal loading conditions. The controller may further use the algorithm to determine a relation between voltage and current data and breaker/recloser/other switch health characteristics under abnormal loading or fault conditions.

In case of measurement sensor attack on voltage or current sensors leading to an indication of electrical fault and thereby leading to breaker/recloser/other switch control (although there is no fault), the controller may use learned relationships between fault (trip) characteristics and breaker/recloser/other switch health characteristics to detect that there is a possible sensor attack, or there is no real electrical fault and the breaker/recloser/other switch should be prevented from tripping, thus avoiding unnecessary load shedding or system imbalance.

In case of remote or local control commands under normal conditions (for example, scheduled maintenance), the controller may check a dynamic breaker/recloser/other switch tag that was computed and placed in the control command using a breaker/recloser/other switch rule table. Control of the breaker/recloser/other switch will only be permitted if the dynamic breaker/recloser/other switch tag matches the tag in the control command. If the dynamic breaker/recloser/other switch tag generated by the rule table does not match the breaker/recloser/other switch tag in the control command, control of the breaker/recloser/other switch will be blocked and possible cyber intrusion will be communicated to an operator. The dynamic breaker/recloser/other switch tag and the breaker/recloser/other switch rule table are dynamic and vary from substation to substation and from time to time. The dynamic breaker/recloser/other switch tags and the breaker/recloser/other switch rule tables are accessible to only genuine operators (based on separate authentication, for example, using biometric authentication such as fingerprint analysis) on a local non-network based or serial communication machine in each substation and/or control center and cannot be accessed by unintentional operators. The current breaker/recloser/other switch rule table in place for each substation may be determined by the system.

The classification decision boundaries may be trained offline using a combinations of historical field data and/or digital twin simulations. In the multi-breaker/recloser/other switch system in a substation, the system may also automatically isolate the attacked breaker/recloser/other switch in real-time or block the unintentional control of the breaker/recloser/other switch to prevent the execution of the malicious control command. If a cyber-attack on the breaker/recloser/other switch is detected from unintentional sources, operators may be informed and alerted immediately. The system is computationally fast and capable of making rapid and real-time detection and isolation with milliseconds of breaker/recloser/other switch operations.

FIG. 1 is a block diagram showing a system 10 for malicious control detection of a power grid 16 including a node 12 and a controller 14. The power grid 16 may include one, two, or more power sources, interconnected by lines. Thus, the power grid 16 may include a network of lines connected by the node 12 and other nodes. The power grid 16 may include at least one source, and at least one load (for example, a customer or user of power drawn from the grid). A fault may be associated with one or more nodes or lines.

The power grid 16 may include components such as at least one switch 18, and/or at least one breaker 20. Instead of, or in addition to at least one breaker 20, the power grid 16 may include a recloser, or any other switch.

In embodiments, the node 12 is a part of a power grid component, such as being a part of the switch 18, the breaker 20, or a circuit recloser. Alternatively, the node 12 may be a separate monitoring device in communication with one or more components of a power grid. Thus, the node 12 may be or may not be connected to a circuit breaker or a circuit recloser or any other switch.

The node 12 may be configured to monitor a single component, or more than one component. Thus, the node 12 may be configured to detect power grid parameters for each power phase. The power grid parameters may include current and voltage. Depending on whether the node is a circuit breaker, a circuit recloser, or any other switch, the power grid parameters may include circuit breaker health parameters, circuit recloser health parameters, or switch health parameters. The node 12 may be configured to generate a signal indicative of time-series sensor measurements for each power phase.

The controller 14 is in communication with the node 12. The controller 14 is configured to receive from each node 12, a respective signal for each power phase, extract at least one feature from the respective signals, provide the at least one feature as an input to a deep-learning model, receive an output from the deep-learning model indicative of a relationship between the power grid parameters and a node health associated with each node. The at least one feature may be based on one or more of (i) principal components, (ii) statistical features, (iii) deep learning features, (iv) frequency domain features, (v) time series analysis features, (vi) logical features, (vii) geographic or position based locations, and (viii) interaction features. The node health may include one or more of arcing current/energy, temperature, operational time, and insulation strength. The deep-learning model may be trained based on features associated with the power grid in a normal operational status, features associated with malicious control of the power grid, and a fault status. The deep-learning model may be further trained to identify the relationship between the power grid parameters and the node health associated with each node as the power grid parameters change.

The controller 14 may be further configured to generate a status tag associated with each node based at least in part on the output. The status tag may be normal or malicious. The status tag may be further generated based at least in part on fixed characteristics and variable characteristics associated with each node. The status tag may be encrypted or hashed. The status tag may also be transmitted to an operator. The controller 14 may be further configured to generate a signal indicative of the status tag.

The controller 14 may be further configured to determine that the malicious status tag is a result of a fault or a malicious attack in response to the at least one feature without receiving any input from an intrusion detection or prevention system. In some embodiments, the controller 14 is configured to send the signal indicative of the status tag to the intrusion detection or prevention system.

FIG. 2 is a flowchart 20 representing the determination of various breaker statuses in response to monitoring breaker parameters. The controller 14 may implement the flowchart 200 according to FIG. 2 to monitor breaker parameters. For example, control commands may be received at a breaker position estimator. The breaker position estimator may also receive measurements such as voltage and current data. The breaker position estimator may then use the measurements and the control commands to estimate a current position of the circuit breaker. The breaker position estimator may be configured to calculate an anomaly confidence score that is reflective of a confidence in the estimation of the current position of the breaker. The current position of the circuit breaker may then communicated to a comparator. The comparator may receive as an input a reported breaker position. The comparator may be configured to compare the reported breaker position with the current position of the breaker. If there is no match between the reported breaker position and the current position of the breaker, then it is determined at an intrusion detection or prevention system if an intrusion has occurred. If an intrusion has been detected, then it may be concluded that the measurements received at the breaker position estimator are normal, but the breaker status is abnormal. If no intrusion has been detected, then it may be concluded that the measurements received at the breaker position estimator are abnormal, but the breaker status is normal.

If there is a match between the reported breaker position and the current position of the breaker, then it is determined at the intrusion detection or prevention system if an intrusion has occurred. If no intrusion has been detected, then it may be concluded that the measurements received at the breaker position estimator are normal, and the breaker status is normal as well. If an intrusion has been detected, then the confidence at the intrusion detection or prevention system that an intrusion has occurred is compared to the confidence at the breaker position estimator of the current position of the breaker. If the confidence that an intrusion has occurred is greater than the confidence in the current position of the breaker, it may be concluded that the measurements received at the breaker position estimator are abnormal, and that the breaker status is abnormal as well. If the confidence that an intrusion has occurred is the same or less than the confidence in the current position of the breaker, then it may be concluded that the measurements received at the breaker position are abnormal, but that the breaker status is normal. In such an instance, feedback may be provided to the intrusion detection or prevention system in order to train the intrusion detection or prevention system to more accurately detect intrusions.

FIG. 3 is a flowchart representing a scheme 30 for establishing relationships between breaker health characteristics and a normal load or a trip. The controller 14 may implement the scheme according to FIG. 3 to monitor breaker health characteristics and determine whether the conditions are indicative of a normal load or a trip. The controller 14 may receive raw sensor data and proceed with a data acquisition process in order to capture voltage and current data and breaker health data. The voltage and current data may be captured when the breaker is experiencing a normal load and also when the breaker is experiencing a trip. This allows the controller to establish a relationship between breaker health characteristics and a normal load associated with the circuit breaker, and also a relationship between breaker health characteristics and a trip associated with the circuit breaker. If a control command is received that is inconsistent with the conditions determined by the controller 14, the controller 14 may determine that the circuit breaker is due for maintenance or that the control command ise malicious. For example, if the controller 14 determines a normal load at the circuit breaker, but a control command is based assuming a trip condition, the controller 14 may consider if the circuit breaker is scheduled for maintenance, or the controller 14 may tag the control command as a malicious control command if no maintenance has been scheduled. If the controller 14 determines a compromised condition at the circuit breaker, such as a trip condition, due to abnormal voltage and/or current data downstream and/or upstream from the circuit breaker, the controller 14 may proceed to determine if the control command is a malicious control command.

FIG. 4 is a diagram representing a scheme 40 for determining whether a control command is malicious and then either executing or blocking the control command based on a rule table. The controller 14 may implement the scheme according to FIG. 4 to determine whether the control command is malicious. When the control command is received, the controller 14 may proceed with data acquisition. For example, the controller 14 may evaluate if the voltage and current data associated with the circuit breaker is normal. The controller 14 may then determine if the control command that was received is a remote control command or a local control command. If the control command is remote, the controller 14 may refer to the breaker remote control authority chart to determine if the control command is malicious. If the control command is local, the controller 14 may refer to the breaker local control authority chart and the maintenance schedule to determine if the control command is malicious. The controller 14 may then use the appropriate authority chart and/or maintenance schedule, along with a breaker rule table, to determine if the control command is malicious. The breaker rule table may include any number of dynamic rules, where each rule corresponds to a breaker dynamic asset tag. If the controller 14 determines that an appropriate breaker dynamic asset tag has not been generated based on the breaker rule table, or that the generated breaker dynamic asset tag is a stale tag or otherwise not a current tag, the controller 14 may tag the control command as being a malicious control command, and cause execution of the control command to be blocked. However, if the controller 14 determines that an appropriate breaker dynamic asset tag has been generated in compliance with the breaker rule table, the controller 14 will permit execution of the control command. As an example, during scheduled maintenance, the control command may include the appropriate breaker dynamic asset tag in compliance with the breaker rules table, so that the breaker dynamic asset tag in the control command matches the breaker tag that is generated by the breaker rules table, thus allowing the execution of the control command.

FIG. 5 is a diagram representing a scheme 50 for sharing a breaker tag to authorize circuit breaker control. The controller 14 may implement the scheme according to FIG. 5 to share a breaker tag in response to an operator request, or in response to an automated request. For example, an operator may submit a breaker tag request to a node, and the node may responsively share the corresponding breaker tag with the operator. In another example, the node may automatically share breaker tags with an Intelligent Electronic Device (IED), such as the controller 14, or the mode may share breaker tags with the IED in response to an automated request from the IED. In some instances, the operator may submit a request for circuit breaker control to the IED, along with the breaker tag that was shared to the operator from the node. If the IED determines that there is a match between the breaker tag that was shared to the IED from the node and the tag that is received from the operator, the IED may be configured to perform breaker control on the appropriate circuit breaker.

In order to detect malicious control in power grids a signal indicative of time-series sensor measurements for each power phase may be received by a controller from at least one node configured to detect power grid parameters for each power phase. The node may be a power grid component, for example, a circuit breaker, a circuit recloser, or any other switch. The power grid parameters may be one of circuit breaker health parameters, circuit recloser health parameters, or switch health parameters. The power grid parameters may include current and voltage. The node health may include one or more of arcing current/energy, temperature, operational time, and insulation strength.

At least one feature may then be extracted from the respective signals. The at least one feature may be based on one or more of (i) principal components, (ii) statistical features, (iii) deep learning features, (iv) frequency domain features, (v) time series analysis features, (vi) logical features, (vii) geographic or position based locations, and (viii) interaction features. The at least one feature may then be provided as an input to a deep-learning model. An output from the deep-learning model indicative of a relationship between the power grid parameters and a node health associated with the at least one node. A status tag associated with the at least one node may be generated based at least in part on the output, wherein the status tag is normal or malicious. The status tag may be generated based at least in part on fixed characteristics and variable characteristics associated with the at least one node. The status tag may be encrypted or hashed, and the status tag may be transmitted to an operator. A signal indicative of the status tag may be generated.

The deep-learning model may be trained based on features associated with the power grid in a normal operational status, features associated with malicious control of the power grid, and a fault status. The deep-learning model may be further trained to identify the relationship between the power grid parameters and the node health associated with the at least one node as the power grid parameters change.

It may be further determined that the malicious status tag is a result of a fault or a malicious attack in response to the at least one feature without receiving any input from an intrusion detection or prevention system. The controller may be configured to send the signal indicative of the status tag to the intrusion detection or prevention system. For example, the intrusion detection system may generate an alert indicative of a malicious attack in response to the signal, even if the intrusion detection system has not detected an IT-based intrusion.

Turning back to FIG. 1, the controller 14 may be implemented by any suitable computer system. The controller 14 may include one or more processors 40 that execute instructions that are stored in one or more memory devices (referred to as memory 42). The instructions may be, for instance, instructions for implementing functionality described as being carried out by one or more modules and systems disclosed above or instructions for implementing one or more of the methods disclosed above. The one or more processors 40 may be embodied in, for example, a CPU, multiple CPUs, a GPU, multiple GPUs, a TPU, multiple TPUs, a multi-core processor, a combination thereof, and the like. In some embodiments, the one or more processors 40 may be arranged in a single processing device.

In other embodiments, the one or more processors 40 may be distributed across two or more processing devices (e.g., multiple CPUs; multiple GPUs; a combination thereof; or the like). A processor may be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 40 can access the memory 42 by means of a communication architecture 44 (e.g., a system bus). The communication architecture 44 may be suitable for the particular arrangement (localized or distributed) and types of the one or more processors 40. In some embodiments, the communication architecture 44 may include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 42 also can retain data.

A controller 14 may include mass storage 48 that is accessible by the one or more processors 40 by means of the communication architecture 44. The mass storage 48 may include machine-accessible instructions (e.g., computer-readable instructions and/or computer-executable instructions). In some embodiments, the machine-accessible instructions may be encoded in the mass storage 48 and can be arranged in components that can be built (e.g., linked and compiled) and retained in computer-executable form in the mass storage 48 or in one or more other machine-accessible non-transitory storage media included in the controller 14. Such components can embody, or can constitute, one or many of the various modules disclosed herein. Additionally, protocols such as Modbus, DNP, IEC 60870, IEC 61850, Profibus, Fieldbus, etc. may be used in conjunction with the systems and methods described herein.

Execution of the modules, individually or in combination, by the one more processors 40, can cause the controller 14 to perform any of the operations described herein.

A controller 14 also can include one or more interface devices 50, which may include one or both of an input/output interface or a network interface that can permit or otherwise facilitate external devices to communicate with the controller 14. For instance, the interface 50 may be used to receive and send data and/or instructions from and to an external computing device.

The network interface devices may permit or otherwise facilitate functionally coupling the controller 14 with one or more external devices. Functionally coupling the controller 14 to an external device may include establishing a wireline connection or a wireless connection between the controller 14 and the external device. The network interface devices may include one or many antennas and a communication processing device that can permit wireless communication between the controller 14 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 4G, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interfaces may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module may be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules may communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module may be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

It should be apparent that the foregoing relates only to certain embodiments of this application and resultant patent. Numerous changes and modifications may be made herein by one of ordinary skill in the art without departing from the general spirit and scope of the invention as defined by the following claims and the equivalents thereof.

Further aspects of the invention are provided by the subject matter of the following clauses:
  1. A system for malicious control detection in a power grid, the system comprising: at least one node configured to detect power grid parameters for each power phase, the at least one node being configured to generate a signal indicative of time-series sensor measurements for the each power phase; and a controller in communication with the node, wherein the controller is configured to: receive from the at least one node, the respective signals; extract at least one feature from the respective signals; provide the at least one feature as an input to a deep-learning model; receive an output from the deep-learning model indicative of a relationship between the power grid parameters and a node health associated with the at least one node; generate a status tag associated with the at least one node based at least in part on the output, wherein the status tag is normal or malicious; and generate a status signal indicative of the status tag.

2. The system of claim 1, wherein the at least one node is one of a circuit breaker, a circuit recloser, or any other switch, and wherein the power grid parameters comprises one of circuit breaker health parameters, circuit recloser health parameters, or switch health parameters.

3. The system of any preceding clause, wherein the power grid parameters comprise current and voltage.

4. The system of any preceding clause, wherein the deep-learning model is trained based on features associated with the power grid in a normal operational status, features associated with malicious control of the power grid, and a fault status.

5. The system of any preceding clause, wherein the deep-learning model is further trained to identify the relationship between the power grid parameters and the node health associated with the at least one node as the power grid parameters change.

6. The system of any preceding clause, wherein the controller is configured to determine that the malicious status tag is a result of a fault or a malicious attack in response to the at least one feature without receiving any input from an intrusion detection or prevention system.

7. The system of any preceding clause, wherein the controller is configured to send the signal indicative of the status tag to the intrusion detection or prevention system.

8. The system of any preceding clause, wherein the at least one feature is based on one or more of (i) principal components, (ii) statistical features, (iii) deep learning features, (iv) frequency domain features, (v) time series analysis features, (vi) logical features, (vii) geographic or position based locations, and (viii) interaction features.

9. The system of any preceding clause, wherein the status tag is generated based at least in part on fixed characteristics and variable characteristics associated with the at least one node.

10. The system of any preceding clause, wherein the status tag is encrypted or hashed, and wherein the status tag is transmitted to an operator.

11. The system of any preceding clause, wherein the node health comprises one or more of arcing current/energy, temperature, operational time, and insulation strength.

12. A method for malicious control detection in a power grid, the method comprising: receiving, by a controller, from at least one node configured to detect power grid parameters for each power phase, a signal indicative of time-series sensor measurements for the each power phase; extracting, by the controller, at least one feature from the respective signals; providing, by the controller, the at least one feature as an input to a deep-learning model; receiving, by the controller, an output from the deep-learning model indicative of a relationship between the power grid parameters and a node health associated with the at least one node; generating, by the controller, a status tag associated with the at least one node based at least in part on the output, wherein the status tag is normal or malicious, and generating, by the controller, a status signal indicative of the status tag.

13. The method of any preceding clause, wherein the at least one node is one of a circuit breaker, a circuit recloser, or any other switch, and wherein the power grid parameters comprises one of circuit breaker health parameters, circuit recloser health parameters, or switch health parameters.

14. The method of any preceding clause, wherein the power grid parameters comprise current and voltage.

15. The method of any preceding clause, wherein the deep-learning model is trained based on features associated with the power grid in a normal operational status, features associated with malicious control of the power grid, and a fault status.

16. The method of any preceding clause, wherein the deep-learning model is further trained to identify the relationship between the power grid parameters and the node health associated with the at least one node as the power grid parameters change.

17. The method of any preceding clause, further comprising: determining, by the controller, that the malicious status tag is a result of a fault or a malicious attack in response to the at least one feature without receiving any input from an intrusion detection or prevention system; and sending a signal indicative of the malicious status tag to the intrusion detection or prevention system.

18. The method of any preceding clause, wherein the at least one feature is based on one or more of (i) principal components, (ii) statistical features, (iii) deep learning features, (iv) frequency domain features. (v) time series analysis features, (vi) logical features, (vii) geographic or position based locations, and (viii) interaction features.

19. The method of any preceding clause, wherein the status tag is generated based at least in prat on fixed characteristics and variable characteristics associated with the at least one node, and wherein the status tag is encrypted or hashed, and wherein the status tag is transmitted to an operator.

20. The method of any preceding clause, wherein the node health comprises one or more of arcing current/energy, temperature, operational time, and insulation strength.

We claim:

1. A system for malicious control detection in a power grid, the system comprising:
   at least one node configured to detect power grid parameters for each power phase, the at least one node being configured to generate a signal indicative of time-series sensor measurements for the each power phase; and
   a controller in communication with the node, wherein the controller is configured to:
   receive from the at least one node, the respective signals;
   extract at least one feature from the respective signals;
   provide the at least one feature as an input to a deep-learning model;
   receive an output from the deep-learning model indicative of a relationship between the power grid parameters and a node health associated with the at least one node;

generate a status tag associated with the at least one node based at least in part on a comparison of the output to planned maintenance, wherein the status tag is normal or malicious; and generate a status signal indicative of the status tag.

2. The system of claim 1, wherein the at least one node is one of a circuit breaker, a circuit recloser, or any other switch, and wherein the power grid parameters comprises one of circuit breaker health parameters, circuit recloser health parameters, or switch health parameters.

3. The system of claim 1, wherein the power grid parameters comprise current and voltage.

4. The system of claim 1, wherein the deep-learning model is trained based on features associated with the power grid in a normal operational status, features associated with malicious control of the power grid, and a fault status.

5. The system of claim 4, wherein the deep-learning model is further trained to identify the relationship between the power grid parameters and the node health associated with the at least one node as the power grid parameters change.

6. The system of claim 1, wherein the controller is configured to determine that the malicious status tag is a result of a fault or a malicious attack in response to the at least one feature without receiving any input from an intrusion detection or prevention system.

7. The system of claim 6, wherein the controller is configured to send the signal indicative of the malicious status tag to the intrusion detection or prevention system.

8. The system of claim 1, wherein the at least one feature is based on one or more of (i) principal components, (ii) statistical features, (iii) deep learning features, (iv) frequency domain features, (v) time series analysis features, (vi) logical features, (vii) geographic or position based locations, and (viii) interaction features.

9. The system of claim 1, wherein the status tag is generated based at least in part on fixed characteristics and variable characteristics associated with the at least one node.

10. The system of claim 1, wherein the status tag is encrypted or hashed, and wherein the status tag is transmitted to an operator.

11. The system of claim 1, wherein the node health comprises one or more of arcing current/energy, temperature, operational time, and insulation strength.

12. A method for malicious control detection in a power grid, the method comprising:

receiving, by a controller, from at least one node configured to detect power grid parameters for each power phase, a signal indicative of time-series sensor measurements for the each power phase;

extracting, by the controller, at least one feature from the respective signals;

providing, by the controller, the at least one feature as an input to a deep-learning model;

receiving, by the controller, an output from the deep-learning model indicative of a relationship between the power grid parameters and a node health associated with the at least one node;

generating, by the controller, a status tag associated with the at least one node based at least in part on a comparison of the output to planned maintenance, wherein the status tag is normal or malicious; and generating, by the controller, a status signal indicative of the status tag.

13. The method of claim 12, wherein the at least one node is one of a circuit breaker, a circuit recloser, or any other switch, and wherein the power grid parameters comprises one of circuit breaker health parameters, circuit recloser health parameters, or switch health parameters.

14. The method of claim 12, wherein the power grid parameters comprise current and voltage.

15. The method of claim 12, wherein the deep-learning model is trained based on features associated with the power grid in a normal operational status, features associated with malicious control of the power grid, and a fault status.

16. The method of claim 15, wherein the deep-learning model is further trained to identify the relationship between the power grid parameters and the node health associated with the at least one node as the power grid parameters change.

17. The method of claim 12, further comprising:

determining, by the controller, that the malicious status tag is a result of a fault or a malicious attack in response to the at least one feature without receiving any input from an intrusion detection or prevention system; and sending a signal indicative of the malicious status tag to the intrusion detection or prevention system.

18. The method of claim 12, wherein the at least one feature is based on one or more of (i) principal components, (ii) statistical features, (iii) deep learning features, (iv) frequency domain features, (v) time series analysis features, (vi) logical features, (vii) geographic or position based locations, and (viii) interaction features.

19. The method of claim 12, wherein the status tag is generated based at least in part on fixed characteristics and variable characteristics associated with the at least one node, and wherein the status tag is encrypted or hashed, and wherein the status tag is transmitted to an operator.

20. The method of claim 12, wherein the node health comprises one or more of arcing current/energy, temperature, operational time, and insulation strength.

* * * * *